（12） United States Patent
Cattani et al.

(10) Patent No.: US 11,323,031 B2
(45) Date of Patent: May 3, 2022

(54) HALF-BRIDGE DRIVER CIRCUIT WITH A SWITCHED CAPACITOR SUPPLY VOLTAGE FOR HIGH SIDE DRIVE SIGNAL GENERATION

(71) Applicant: STMicroelectronics S.r.l., Agrate Brianza (IT)

(72) Inventors: Alberto Cattani, Cislago (IT); Alessandro Gasparini, Cusano Milanino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 19 days.

(21) Appl. No.: 16/924,410

(22) Filed: Jul. 9, 2020

(65) Prior Publication Data

US 2021/0013808 A1 Jan. 14, 2021

(30) Foreign Application Priority Data

Jul. 11, 2019 (IT) .......................... 102019000011544

(51) Int. Cl.
*H02M 3/158* (2006.01)
*H02M 1/08* (2006.01)
*H02M 1/00* (2006.01)

(52) U.S. Cl.
CPC ....... *H02M 3/1582* (2013.01); *H02M 1/0006* (2021.05); *H02M 1/08* (2013.01); *H02M 3/1588* (2013.01)

(58) Field of Classification Search
CPC .... H02M 1/0006; H02M 1/0029; H02M 1/08; H02M 1/44; H02M 3/155; H02M 3/1582;
(Continued)

(56) References Cited

U.S. PATENT DOCUMENTS 6,025,705 A 2/2000 Nguyen et al.
6,384,687 B1 5/2002 Maida
(Continued)

FOREIGN PATENT DOCUMENTS

CN 207010539 U 2/2018
JP 2014023269 A * 2/2014

OTHER PUBLICATIONS

IT Search Report and Written Opinion for IT Appl. No. 102019000011544 dated Mar. 25, 2020 (9 pages).
(Continued)

*Primary Examiner* — Kyle J Moody
*Assistant Examiner* — Jye-June Lee
(74) *Attorney, Agent, or Firm* — Crowe & Dunlevy (57) ABSTRACT

First and second FETs of a half-bridge are series connected between first and second terminals and are gate driven, respectively, by first and second drivers. An inductance is connected to the intermediate node of the half-bridge. Power supply for the second driver circuit is a supply voltage generated by a voltage regulator as a function of the voltage between the first and the second terminal. Power supply for the first driver circuit is a supply voltage generated by a bootstrap capacitor having a first terminal connected via a first switch to receive the supply voltage output from the voltage regulator and a second terminal connected to the intermediate node. The first terminal of the bootstrap capacitor is further connected by a second switch to receive a second supply voltage. A control circuit generates control signals for the first and second driver circuits and the first and second switches.

14 Claims, 6 Drawing Sheets

(58) Field of Classification Search
CPC ............ H03K 17/063; H03K 17/6871; H03K 2217/0063; H03K 2217/0072; H03K 2217/0081
See application file for complete search history.

(56) References Cited

U.S. PATENT DOCUMENTS

| | | | |
|---|---|---|---|
| 6,812,782 B2 * | 11/2004 | Grant | H02M 1/08 327/589 |
| 7,019,551 B1 | 3/2006 | Biesterfeldt | |
| 7,872,456 B2 | 1/2011 | Li et al. | |
| 8,558,586 B1 * | 10/2013 | Martin | H03K 17/6871 327/108 |
| 8,643,419 B2 | 2/2014 | Rueger | |
| 9,929,652 B1 | 3/2018 | Ribarich et al. | |
| 10,554,204 B1 | 2/2020 | Young et al. | |
| 10,615,779 B1 | 4/2020 | Butenhoff et al. | |
| 10,763,843 B2 * | 9/2020 | Shankar | H02M 1/08 |
| 2002/0113634 A1 | 8/2002 | Spurlin | |
| 2007/0046275 A1 | 3/2007 | Shirai et al. | |
| 2008/0088283 A1 | 4/2008 | Ruobiao et al. | |
| 2012/0043950 A1 | 2/2012 | Truong et al. | |
| 2013/0113524 A1 | 5/2013 | Rueger | |
| 2014/0203846 A1 | 7/2014 | Janschitz et al. | |
| 2014/0217959 A1 * | 8/2014 | Chen | H02M 3/1582 320/107 |
| 2015/0188328 A1 | 7/2015 | Abouda et al. | |
| 2016/0094210 A1 | 3/2016 | Poletto et al. | |
| 2016/0118894 A1 | 4/2016 | Zhang et al. | |
| 2016/0301401 A1 | 10/2016 | Won et al. | |
| 2017/0012618 A1 | 1/2017 | Krishna | |
| 2017/0033677 A1 * | 2/2017 | Wu | H02M 1/08 |
| 2017/0250609 A1 | 8/2017 | Zhang et al. | |
| 2017/0302178 A1 | 10/2017 | Bandyopadhyay et al. | |
| 2018/0294719 A1 | 10/2018 | Khatib et al. | |
| 2019/0238129 A1 | 8/2019 | Fukushima et al. | |
| 2019/0245534 A1 | 8/2019 | Takayama | |
| 2020/0225687 A1 | 7/2020 | Ichikawa et al. | |
| 2020/0381989 A1 | 12/2020 | Kuang | |
| 2021/0013808 A1 | 1/2021 | Cattani et al. | |
| 2021/0126538 A1 * | 4/2021 | Puia | H02M 1/0006 |
| 2021/0159775 A1 | 5/2021 | O Malley et al. | |
| 2021/0313980 A1 | 10/2021 | Zhou et al. | |

OTHER PUBLICATIONS

Fairchild: "AN-6076 Design and Application Guide of Bootstrap Circuit for High-Voltage Gate-Drive IC", Dec. 30, 2008, XP055715144 (15 pages).

* cited by examiner

HALF-BRIDGE DRIVER CIRCUIT WITH A SWITCHED CAPACITOR SUPPLY VOLTAGE FOR HIGH SIDE DRIVE SIGNAL GENERATION

PRIORITY CLAIM

This application claims the priority benefit of Italian Application for Patent No. 102019000011544, filed on Jul. 11, 2019, the content of which is hereby incorporated by reference in its entirety to the maximum extent allowable by law.

TECHNICAL FIELD

The embodiments of the present description refer to a half-bridge driver circuit. Embodiments of the present description may be used to drive a half-bridge of an inverting buck-boost converter.

BACKGROUND

Electronic converters, such as for example AC/DC or DC/DC switched mode power supplies, are well known in the art. There exist many types of electronic converters that may be divided mainly into isolated and non-isolated converters. For example, non-isolated electronic converters are converters of the buck, boost, buck-boost, Cuk, SEPIC, and ZETA types. Instead, isolated converters comprise a transformer, such as flyback and forward converters. These types of converters are well known to the person skilled in the art.

Such electronic converters are commonly used in circuit applications to generate appropriate voltages required by a complex system to work and to guarantee requested performance. Many of these systems have a particular focus on efficiency and power consumption in order to reach a longer operating life in case of a battery equipped system. In such applications, where often a number of electronic chips and circuits are installed in a very small space, it is often very important to have the possibility to control and limit electromagnetic interference (EMI) that a circuit produces and that can induce problems to the other circuits, in particular to antennas and radio-transmitters.

In order to have the possibility to manage EMI in electronic converters, it is often required to control the slew-rate of the high-frequency switching nodes. These nodes are the main contributor to EMI emission and, by controlling their slew-rate, it is possible to mitigate their effect and in particular reduce their emission with a slower slew-rate. For example, when using Field Effect Transistors (FET), such as Metal-Oxide-Semiconductor Field-Effect Transistors (MOSFET), for the electronic switches associated with the switching nodes of the electronic converter, such a slew rate control may be implemented in the driver circuit(s) for such FET. See, for example, United States Patent Application Publication No. 2017/0222638 A1, which is incorporated herein by reference.

Figure 1:
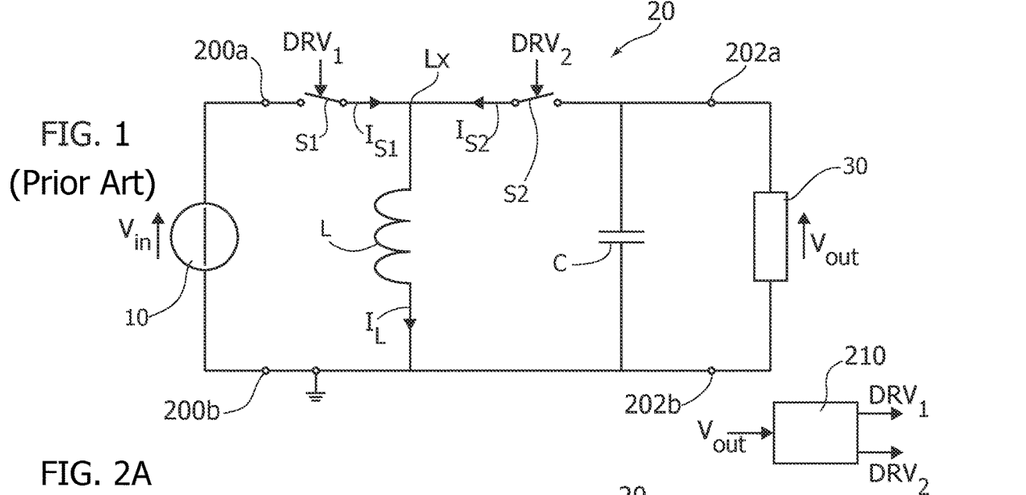
FIG. 1 shows an example of an inverting buck-boost converter.

For example, FIG. 1 shows an example of an inverting buck-boost converter 20. In the example considered, the electronic converter 20 comprises a first and a second input terminal 200a and 200b for receiving a DC input voltage $V_{in}$ and a first and a second output terminal 202a and 202b for providing a DC output voltage $V_{out}$. For example, the input voltage $V_{in}$ may be provided by a DC voltage source 10, such as a battery. Generally, the DC input voltage $V_{in}$ may also be generated via a rectifier circuit from an AC voltage. Conversely, the output voltage $V_{out}$ may be used to supply an electric load 30.

In the example considered, two electronic switches S1 and S2 are connected (e.g., directly) in series between the terminals 200a and 202a. Moreover, an intermediate point Lx between the two electronic switches is connected (e.g., directly) via an inductor L to the terminal 200b, which usually is connected (e.g., directly) to the terminal 202b. The terminal 200b represent thus a reference voltage, which is usually ground.

Often an inverting buck-boost converter comprises also a capacitor C connected (e.g., directly) between the terminals 202a and 202b.

Typically, the switches S1 and S2 are driven via a control circuit 210 which generates respective drive signals $DRV_1$ and $DRV_2$ for the switches S1 and S2.

Figure 2A:
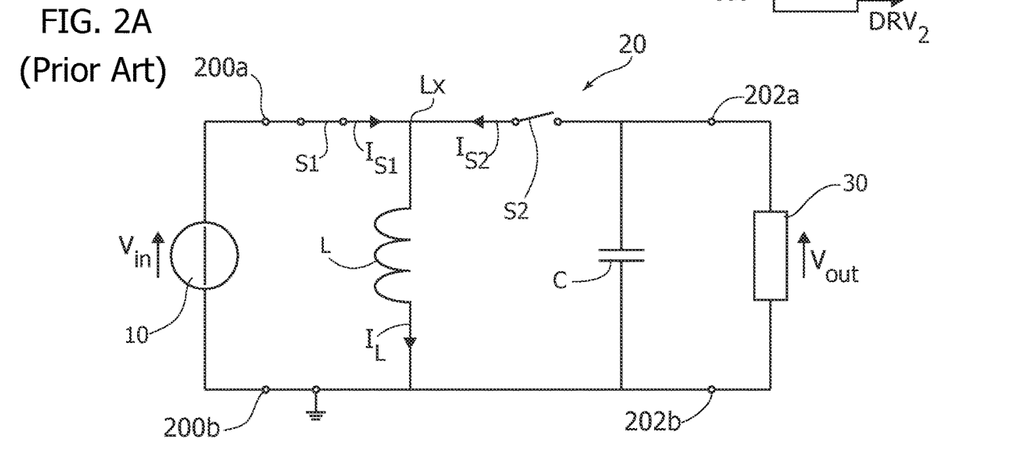
FIGS. 2A and 2B show typical switching states of the converter of FIG. 1.
Figure 2B:
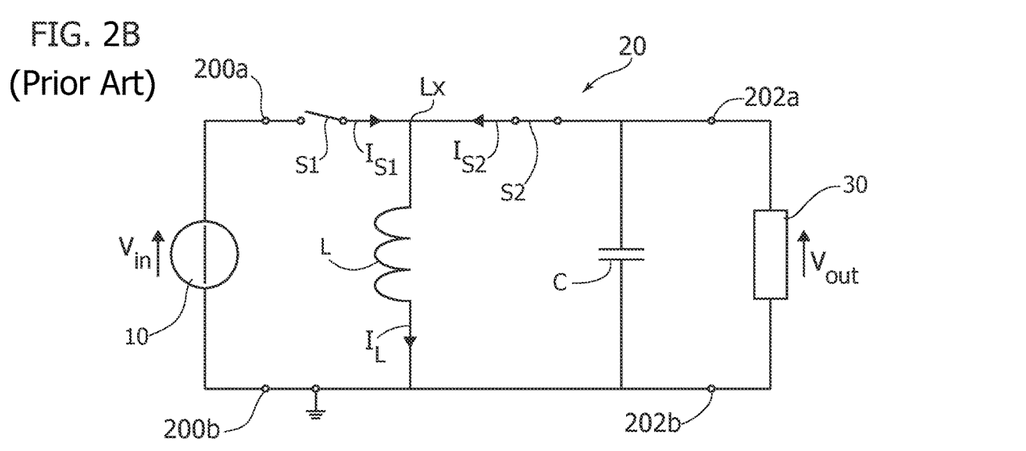

FIGS. 2A and 2B show in this respect the main switching states of such a converter.

Specifically, as shown in FIG. 2A, in a first switching state, the electronic switch S1 is closed and the electronic switch S2 is opened. Accordingly, the inductor L is connected to the input voltage $V_{in}$. Thus, the current $I_L$ flowing through the inductor L increases substantially linearly.

Conversely, as shown in FIG. 2B, in a second switching state, the electronic switch S1 is opened and the electronic switch S2 is closed. Accordingly, the inductor L is connected to generate the output voltage $V_{out}$ at the capacitor C. Thus, the current $I_L$ flowing through the inductor L decreases and is transferred to the converter output to charge the capacitor C. Assuming that the terminal 200a is a positive input terminal with respect to the negative input terminal 200b, i.e. the voltage $V_{in}$ is positive, and taking into account also the flow direction of the inductor current $I_L$, the terminal 202b will thus be a positive output terminal and the terminal 202a will be a negative output terminal, i.e. the voltage $V_{out}$ is negative.

Figure 3A:
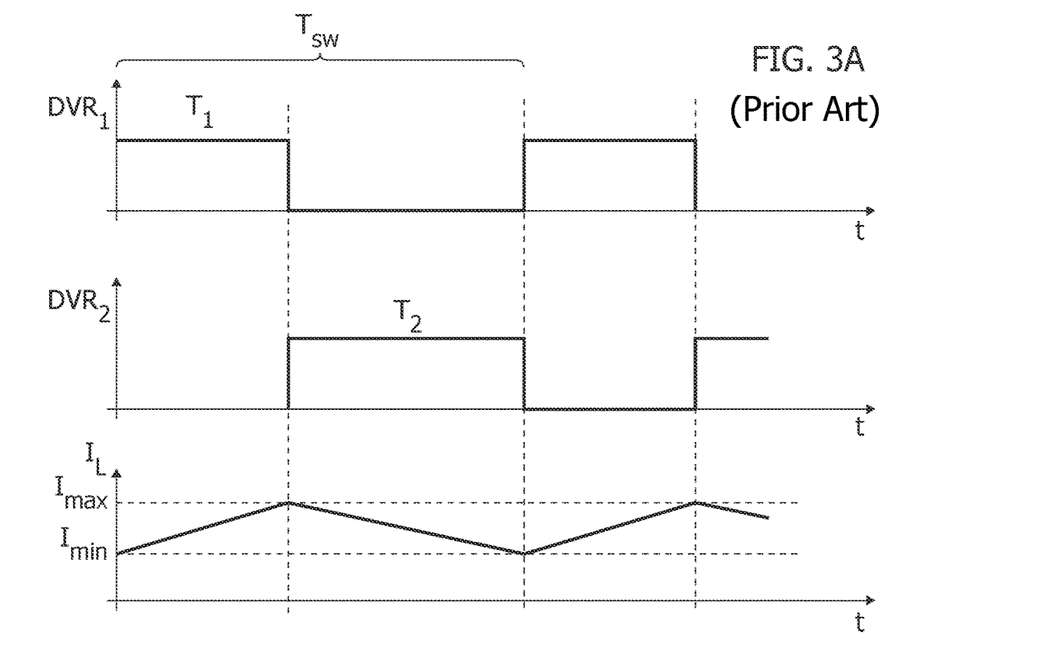
FIGS. 3A and 3B show possible operating modes of the converter of FIG. 1.
Figure 3B:
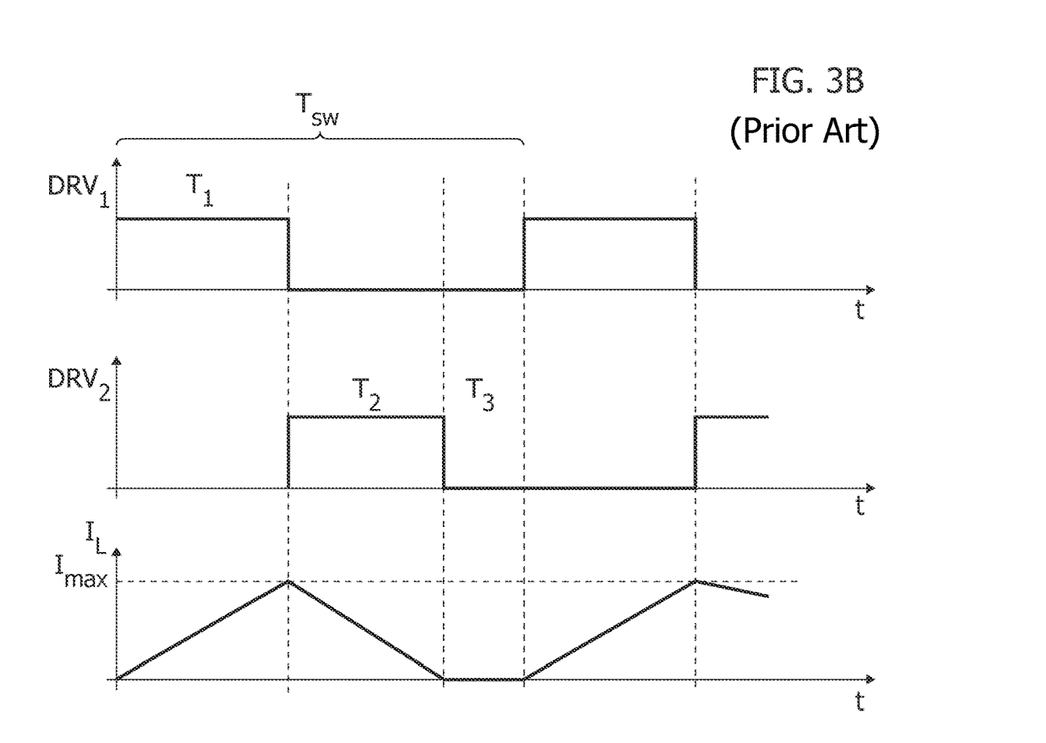

Such an inverting buck-boost converter may thus be operated essentially with two modes, which are shown in FIGS. 3A and 3B.

As shown in FIG. 3A, when the current $I_L$ flowing through the inductor L never falls to zero during a commutation cycle $T_{SW}$, the converter is said to operate in continuous conduction mode (CCM). In this case, the converter is operated during a first time interval $T_1$ with the switching mode shown in FIG. 2A and for a second time interval $T_2$ with the switching mode shown in FIG. 2B, with $T_{SW}=T_1+T_2$.

Conversely, as shown in FIG. 3B, when the current $I_L$ flowing through the inductor L falls to zero during a commutation cycle $T_{SW}$, the converter is said to operate in discontinuous conduction mode (DCM). Typically, this is the case when the amount of energy required by the load 30 is small enough to be transferred in a time smaller than the whole commutation period. Substantially, in this case, the converter has three switching phases $T_1$, $T_2$ and $T_3$, with $T_{SW}=T_1+T_2+T_3$. Specifically, the converter is again operated with the switching mode shown in FIG. 2A during the first time interval $T_1$ and with the switching mode shown in FIG. 2B during the second time interval $T_2$. Conversely, during the third time interval $T_3$ both electronic switches S1 and S2 are opened and the inductor current $I_L$ is zero. Specifically, the interval $T_2$ ends and the interval $T_3$ starts when the inductor current $I_L$ reaches zero.

Various kinds of control schemes may thus be implemented in the control circuit 210. For example, one of the most widely used control scheme is a Pulse Width Modulation (PWM), wherein the switching period $T_{SW}$ is constant and the drive signal $DRV_1$ corresponds to a PWM signal, wherein the control circuit varies the duty cycle of the signal $DRV_1$ as a function of the output voltage $V_{out}$. In this case, the control circuit 210 implements typically a regulator comprising an Integral (I) component and possibly also a Proportional (P) and/or Derivative (D) component. Conversely, the switch S2 is closed when the switch S1 is opened and the switch S2 is opened again either when a new switching cycle starts (CCM mode) or when the inductor current $I_L$ reaches zero (DCM mode).

Another control scheme is the pulse skip mode (PSM) or burst mode. In this case, the interval $T_1$ has typically a fixed duration and the interval $T_1$ starts when the output voltage $V_{out}$ falls below a given threshold voltage. Thus, in this case a sequence of pulses or bursts is generated until the output voltage $V_{out}$ is greater than the given threshold voltage. In this case, the pulse generation is stopped until the output voltage $V_{out}$ falls again below the given threshold voltage.

Thus, in the example considered, the node Lx represents the main switching node of the electronic converter 20 and its slew-rate should be controlled to reduce EMI. Thus, the control circuit 210 should correctly implement slew-rate controlled transition in all operating condition supported by the converter 20 (Continuous Current Mode, Discontinuous Current Mode, Pulse Skip Mode).

Considering the foregoing, there is a need in the art to provide solutions for driving electronic switches, in particular field effect transistors (FET).

SUMMARY

According to one or more embodiments, a half-bridge driver circuit is provided.

In general, the half-bridge circuit comprises a first, a second and a third terminal, wherein a half-bridge comprising a first (high-side) and a second (low-side) n-channel FET are connected in series between the first and the second terminal. Accordingly, the intermediate node between the first and the second n-channel FET represents a switching node, wherein an inductance is connected between the switching node and the third terminal.

Accordingly, the half-bridge circuit may be an inverting buck-boost converter, wherein the first terminal and the third terminal are configured to receive an input voltage, and the second terminal and the third terminal are configured to provide an output voltage. However, the half-bridge circuit may also be a buck converter, wherein the first terminal and the second terminal are configured to receive an input voltage, and the third terminal and the second terminal are configured to provide an output voltage.

In various embodiments, a first and a second driver circuit are used to drive the gate terminal of the first and the second n-channel FET as a function of a first and a second drive signal, respectively.

In various embodiments, a control circuit is configured to generate the first and the second drive signal for the first and the second n-channel FET in order to: during a first time interval, close the first n-channel FET and open the second n-channel FET; during a second time interval, open the first n-channel FET and close the second n-channel FET; and during a third time interval, open both the first n-channel FET and the second n-channel FET.

Accordingly, when the half-bridge circuit is used to implement an electronic converter, such electronic converter may be operated in a discontinuous conduction mode or a pulse skip mode. For example, in various embodiments, the control circuit may vary the durations of one or more of these time intervals in order to regulate the output voltage of the electronic converter.

In various embodiments, the second driver circuit (for the low side switch) is powered via a voltage regulator. Specifically, this voltage regulator is configured to generate at an output terminal of the voltage regulator a first supply voltage as a function of the voltage between the first and the second terminal. Accordingly, the second driver circuit may generate a charge current at the gate terminal of the second (low side) n-channel FET as a function of the second drive signal, thereby charging a gate-source capacitance of the second n-channel FET to one of: the first supply voltage, thereby closing the second n-channel FET, or the voltage at the second terminal, thereby opening the second n-channel FET.

Conversely, in various embodiments, the first driver circuit is powered via the voltage at a (bootstrap) capacitor. Specifically, this capacitor comprises a first terminal connected via a first electronic switch to the output terminal of the voltage regulator and a second terminal connected to the switching node. Moreover, in various embodiments, a second electronic switch is connected between the first terminal of the capacitor and a second supply voltage. Specifically, while the first supply voltage is referred to the second terminal of the half-bridge circuit, the second supply voltage is referred to the third terminal of the half-bridge circuit.

Accordingly, the first driver circuit may generate a charge current at the gate terminal of the first (high side) n-channel FET as a function of the first drive signal, thereby charging a gate-source capacitance of the first n-channel FET to one of: the voltage at the first terminal of the capacitor, thereby closing the first n-channel FET, or the voltage at the switching node, thereby opening the first n-channel FET.

In various embodiments, the control circuit generates also a third and a fourth drive signal for the first and the second electronic switch in order to: during the first time interval, open both the first and the second electronic switch; during the second time interval, close the first electronic switch and open the second electronic switch; and during the third time interval, open the first electronic switch and close the second electronic switch.

Accordingly, in various embodiments, the capacitor is charged during the second time interval (when the second n-channel FET is closed) to the first supply voltage and during the third time interval (when both the first n-channel FET and the second n-channel FET are opened) to the second supply voltage, thereby ensuring that the capacitor is charged and the first driver circuit has a suitable supply voltage to close the first n-channel FET in all operating conditions of the half-bridge circuit.

BRIEF DESCRIPTION OF THE DRAWINGS

The embodiments of the present disclosure will now be described with reference to the annexed plates of drawings, which are provided purely to way of non-limiting example and in which.

DETAILED DESCRIPTION

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

In FIGS. 4 to 9 described below, parts, elements or components that have already been described with reference to FIGS. 1 to 3 are designated by the same references used previously in these figures. The description of these elements has already been made and will not be repeated in what follows in order not to burden the present detailed description.

As explained in the foregoing, various embodiments of the present description concern solutions for driving a Field Effect Transistors, in particular in the context of a half-bridge, such as the electronic switches of an inverting buck-boost converter. In particular, various embodiments of the present disclosure relate to a half-bridge driver for the switches of such a half-bridge.

Figure 4:
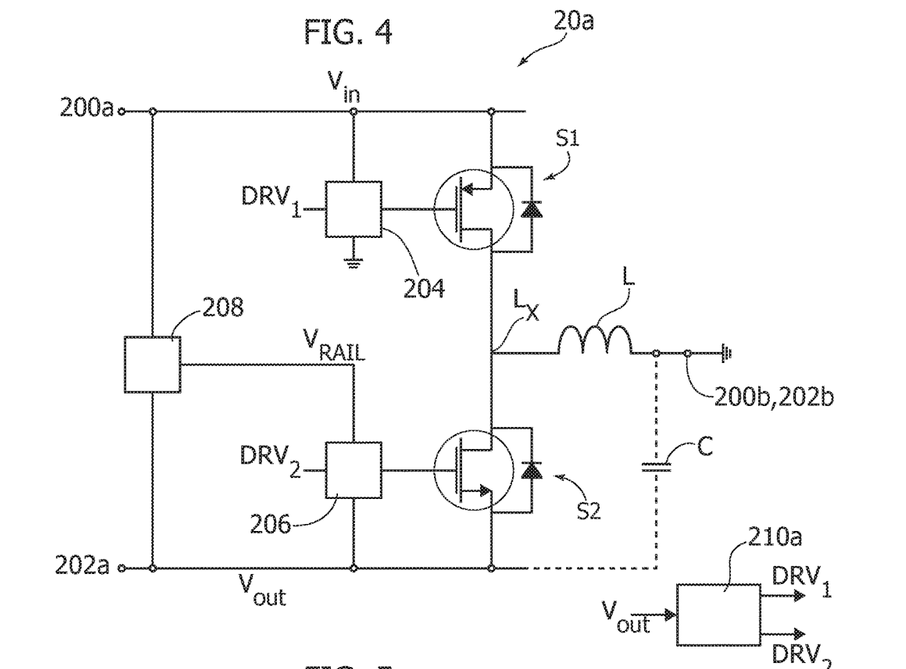
FIG. 4 shows a first embodiment of a half-bridge driver circuit.

FIG. 4 shows a first embodiment. Specifically, FIG. 4 shows a generic half-bridge circuit 20a. Accordingly, the circuit comprises two terminals 200a and 202a, wherein a half-bridge comprising two electronic switches S1 and S2 is connected (e.g. directly) between these two terminals. Specifically, in various embodiments, the switches are FETs, such as MOSFETs. Such transistors typically have an associated respective body diode, which is schematically shown in FIG. 4. Accordingly, in the embodiment considered, the half-bridge is connected between a first voltage at the terminal 200a and a second voltage at the terminal 202a.

Generally, the intermediate node between the electronic switches S1 and S2 represents a switching node Lx, and by driving the switches S1 and S2 in a suitable manner, the switching node Lx may be: connected to the voltage at the node 200a by closing the electronic switch S1 and opening the electronic switch S2 (as shown with respect to the interval $T_1$ in FIG. 3B), connected to the voltage at the node 202a by opening the electronic switch S1 and closing the electronic switch S2 (as shown with respect to the interval $T_2$ in FIG. 3B), or disconnected by opening both the electronic switch S1 and the electronic switch S2 (as shown with respect to the interval $T_3$ in FIG. 3B).

For example, in the context of an inverting buck-boost converter, the switching node Lx may be connected via an inductor L to a further terminal of the half-bridge circuit 20a. For example, this further terminal corresponds to the terminals 200b and 202b shown in FIG. 1. However, such a half-bridge circuit 20a may also be used to drive other inductive components, e.g. the inductor L may be replaced directly with an inductive load, such as an electric motor.

In fact, in order to drive such inductive components, it is sufficient that the voltage between the terminals 200a and 200b/202b is positive and the voltage between the terminals 202a and 200b/202b is negative. For example, in the case of an inverting buck-boost converter, the terminal(s) 200b/202b are connected to ground, the terminal 200a is connected to the (positive) input voltage $V_{in}$ (with respect to the terminal(s) 200b/202b) and the terminal 202a is connected to the (negative) output voltage $V_{out}$ (with respect to the terminal(s) 200b/202b).

In various embodiments, a capacitor C may be connected (e.g., directly) between the terminals 202a and 200b/202b.

As mentioned in the foregoing, various embodiments relate specifically to the driving of the transistors S1 and S2, permitting a slew-rate control of the switching node Lx.

Specifically, in the embodiment shown in FIG. 4, the switch S1, representing a high-side switch of the half-bridge, is a p-channel FET, such as a p-channel MOSFET, i.e. a PMOS. Conversely, the switch S2, representing a low-side switch of the half-bridge, is a n-channel FET, such as a n-channel MOSFET, i.e. a NMOS.

In the embodiment considered, a control circuit 210a provides digital control signals $DRV_1$ and $DRV_2$, typically having either a low or a high logic level, which should be converted into respective drive signals for the gate terminals of the transistors S1 and S2, implementing also a slew-rate control.

For this purpose, the transistor S1 has associated a driver circuit 204 configured to receive the (binary) control signal $DRV_1$ and generate a signal, typically a current signal, used to drive the gate terminal of the transistor S1 and generate a suitable gate-source voltage $V_{GS}$ at the gate-source capacitance of the transistor S1. For example, by varying the charge current of the gate-source capacitance provided by the driver circuit 204, the driver circuit 204 may implement a slew-rate control.

Similarly, the transistor S2 has associated a driver circuit 206 configured to receive the (binary) control signal $DRV_2$ and generate a signal, typically a current signal, used to drive the gate terminal of the transistor S2 and generate a suitable gate-source voltage $V_{GS}$ at the gate-source capacitance of the transistor S2. For example, by varying the charge current of the gate-source capacitance provided by the driver circuit 206, the driver circuit 206 may implement a slew-rate control.

For example, for a possible generation of such a current in order to implement a slew-rate control, reference can be made again to the above cited United States Patent Application Publication No. 2017/0222638 A1.

Such a slew-rate control usually requires that the driver circuits receive rather stable supply voltages. For example, assuming that the voltages at the nodes 200a and 200b are rather stable with respect to the voltage at the node 200b/202b (which is usually also the case for an inverting buck-boost converter), the driver circuit 204 could drive the gate terminal of the PMOS S1 between the voltage at the node 200a ($V_{in}$) and the voltage at the node 200b/202b (e.g., ground). Conversely, the driver circuit 206 could drive the gate terminal of the NMOS S2 between a voltage $V_{RAIL}$ and the voltage at the terminal 202a ($V_{out}$), wherein the voltage $V_{RAIL}$ is greater than the voltage at the terminal 202a ($V_{out}$). For example, in FIG. 4 is shown a voltage regulator 208 configured to generate the voltage $V_{RAIL}$ based on the voltage between the terminals 200a and 202a. For example, in various embodiments the voltage regulator 208 may be a linear voltage regulator.

The inventors have observed that this architecture has several drawbacks, in particular concerning the use of a PMOS power transistor S1. In fact, such PMOS power transistors are usually less optimized than NMOS power transistors. For example, a larger area is needed for a PMOS transistor in order to match the switch on resistance $R_{ON}$ achievable with an NMOS transistor and this larger dimension may require a significantly larger driver 204, resulting also in a greater noise during normal switching activity of the half-bridge.

Moreover, dependent on the specific application, the voltage $V_{in}$ between the terminals 200a and 200b/202b may have a voltage swing, which is often the case in electronic converters. In this case, the PMOS S1 has to be over-designed to match the switch on resistance $R_{ON}$ also with a lower voltage $V_{in}$, which would result also in a small gate-source voltage $V_{GS}$ at the PMOS S1.

Generally, this problem could be avoided by providing an additional voltage regulator also for supplying the driver circuit 204. Generally, such an additional voltage regulator could also be useful when the voltage $V_{in}$ is significantly higher than the requested gate-source voltage $V_{GS}$. However, such an additional voltage regulator would increase the complexity and cost of the circuit 20a.

Figure 5:
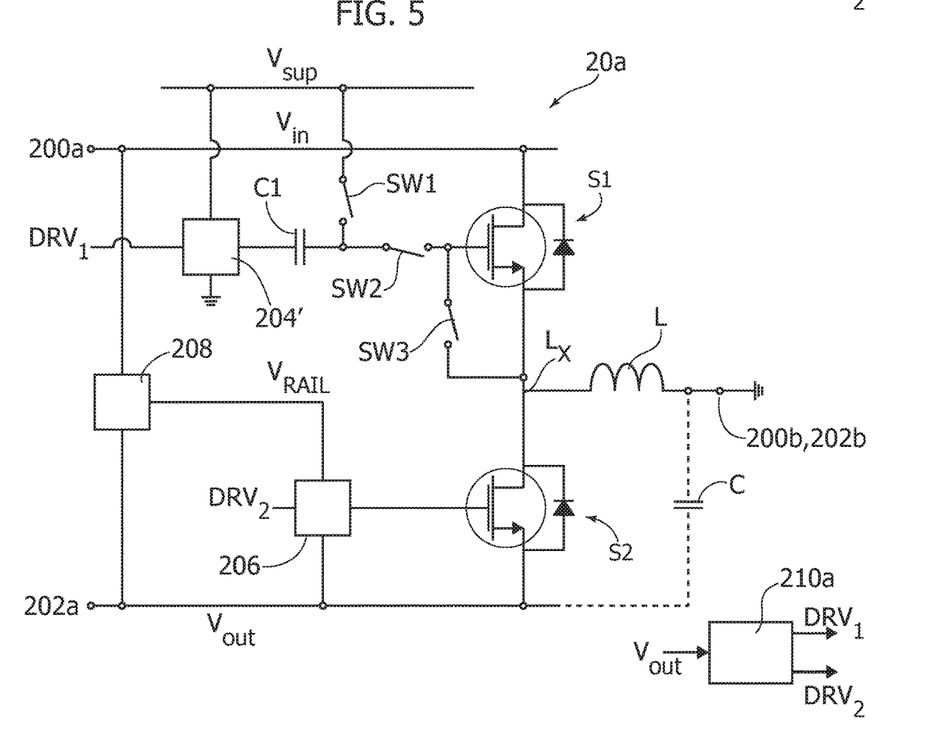
FIG. 5 shows a second embodiment of a half-bridge driver circuit.

FIG. 5 shows a second embodiment of the circuit 20a. Specifically, in the embodiment considered, the p-channel FET S1 of FIG. 4 has been replaced with an n-channel FET, such as a NMOS. Accordingly, in the embodiment considered, the drain terminal of the transistor S1 is connected (e.g., directly) to the terminal 200a, the source terminal of the transistor S1 is connected (e.g., directly) to the switching node Lx, which in turn is connected (e.g., directly) to the drain terminal of the transistor S2, and the source terminal of the transistor S2 is connected (e.g., directly) to the terminal 202a.

In the embodiment considered, the gate terminal of the transistor S2 is again driven via the driver circuit 206 as a function of the signal $DRV_2$, wherein the driver circuit may have associated a respective voltage regulator 208 providing the voltage $V_{RAIL}$. Accordingly, in the embodiment considered, the driver circuit may set the gate-source voltage $V_{GS}$ of the transistor S2 either to the voltage $V_{RAIL}$ or zero, while possibly performing a slew-rate control during the transitions.

Conversely, the gate terminal of the transistor S1 is driven via the driver circuit 204' as a function of the signal $DRV_1$, wherein the driver circuit 204' is connected to a voltage $V_{sup}$ and the terminal 200b/202b representing a ground.

Specifically, in the embodiment considered, the driver circuit 204' does not drive directly the gate terminal of the transistor S1, but a decoupling capacitor C1 is interposed between the driver circuit 204' and the gate terminal of the transistor S1.

Thus, by applying positive and negative transitions to the first terminal of the capacitor C1, these transitions are transferred to the gate terminal of the transistor S1, thereby switching on or off the transistor S1. In various embodiments, a first electronic switch SW1 may be used to recharge the decoupling capacitor C1 when the NMOS S1 is switched off. For this purpose, a second electronic switch SW2 may be used to disconnect the capacitor C1 from gate terminal of the transistor S1 and a third electronic switch SW3 that shorts the gate terminal of the transistor S1 to the node LX.

In this kind of architecture, it is possible to use a couple of NMOS power transistors that can guarantee the best performance achievable in term of switch-on resistance $R_{ON}$, area occupation, gate capacitance and so on. However, the inventors have observed that with this solution is not easily possible to apply a slew-rate control to the high-side power transistor S1, insofar as driver circuit 204' does not have any a feedback of the actual gate-source voltage $V_{GS}$ of the transistor S1. Conversely, applying a slew-rate control only to the low-side transistor S2 does not guarantee that the slew-rate of the switching node Lx is always well controlled in all the operating condition of the circuit 20a (e.g., an inverting buck-boost converter). Another possible issue of this kind of driver is that the high-side transistor S1 is driven via a floating capacitor C1 that cannot force a real DC bias to the gate terminal of the transistor S1, possibly resulting in unstable/unknown conditions due to the floating gate of the transistor S1.

Figure 6:
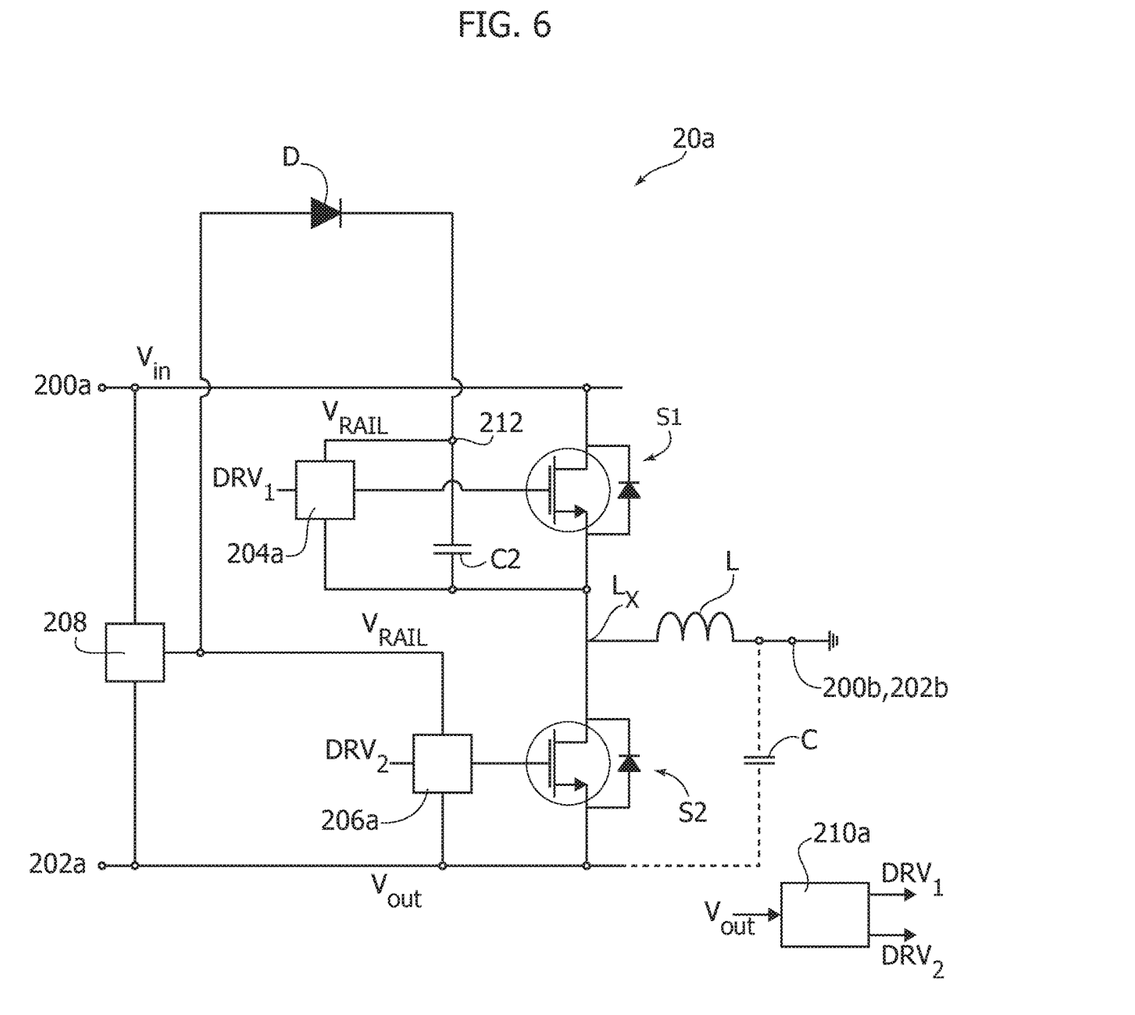
FIG. 6 shows a third embodiment of a half-bridge driver circuit.

FIG. 6 shows an embodiment of the circuit 20a able to overcome the drawbacks of the solutions shown in FIGS. 4 and 5.

In the embodiments considered, the transistors S1 and S2 are again n-channel FET, such as NMOS. Moreover, the gate terminal of the transistor S2 is driven via the driver circuit 206a and the respective voltage regulator 208 already described with respect to FIGS. 4 and 5. However, the driving of the gate terminal of the transistor S1 is different.

Specifically, in the embodiment considered, the gate terminal of the transistor S1 is driven by a driver circuit 204a, wherein the driver circuit 204a is powered via a bootstrap circuit, essentially comprising a diode D and a capacitor C2.

More specifically, in the embodiment considered, the output of the voltage regulator 208 providing the voltage $V_{RAIL}$ is connected via the diode D and the capacitor C2 to the switching node Lx. Specifically, the anode of the diode D is connected (e.g., directly) to the voltage $V_{RAIL}$ the cathode of the diode D is connected (e.g., directly) to a first terminal of the capacitor C2, indicated in the following as node 212, and the second terminal of the capacitor is connected (e.g., directly) to the node Lx.

Substantially, when the switch S2 is closed, the switching node Lx is connected to the terminal 202a and the capacitor C2/node 212 is charged to a voltage $V_{RAIL2}=V_{RAIL}-V_{DIODE}$ (where $V_{DIODE}$ corresponds to the forward voltage of the diode D). Conversely, when the switch S2 is opened, the capacitor C2 will maintain the voltage $V_{RAIL2}=V_{RAIL}-V_{DIODE}$, irrespective of the voltage at the switching node Lx, i.e. the node 212 will have a voltage being greater than the voltage at the source terminal of the transistor S1. Thus, by powering the driver 204a with the voltage at the capacitor C2, the driver circuit 204a may drive the gate terminal of the transistor S1 with a voltage selected between $V_{Lx}$ and $V_{RAIL2}+V_{Lx}$.

Accordingly, in the embodiment considered and similar to what is described in United States Patent Application Publication No. 2017/0222638 A1, the driver circuits 204a and 206 are powered via respective positive supply voltages $V_{RAIL2}$ and $V_{RAIL}$ (indicated generically as Vdd in United States Patent Application Publication No. 2017/0222638 A1), which are referred to the source terminal of the respective transistor.

The inventors have observed that the solution shown in FIG. 6 does not operate always correctly. Specifically, the inventors have observed that the solution shown in FIG. 6 may be used when the inductor L is operated in the CCM mode (see also FIG. 3A), because the node Lx is connected during the interval $T_2$ regularly to node 202a, thereby ensuring that the capacitor C2 is re-charged. Conversely, in the DCM and in particular the PSM mode (see also FIG. 3B), the switching node Lx is disconnected and has essentially the voltage of the node 200b/202b. However, this voltage is usually greater than the voltage $V_{RAIL}$ (i.e., the capacitor C2 is not charged further). Thus, in the embodiment shown in FIG. 6, the capacitor C2 is not charged during the interval $T_3$. Thus, in case the interval $T_3$ is long, as it is usually the case for the PSM mode (in which one or more switching cycles may be switched essentially by setting $T_3=T_{SW}$), the capacitor C2 may be discharged and the voltage $V_{RAIL2}$ may be insufficient in order to correctly drive the transistor S1.

Figure 7:
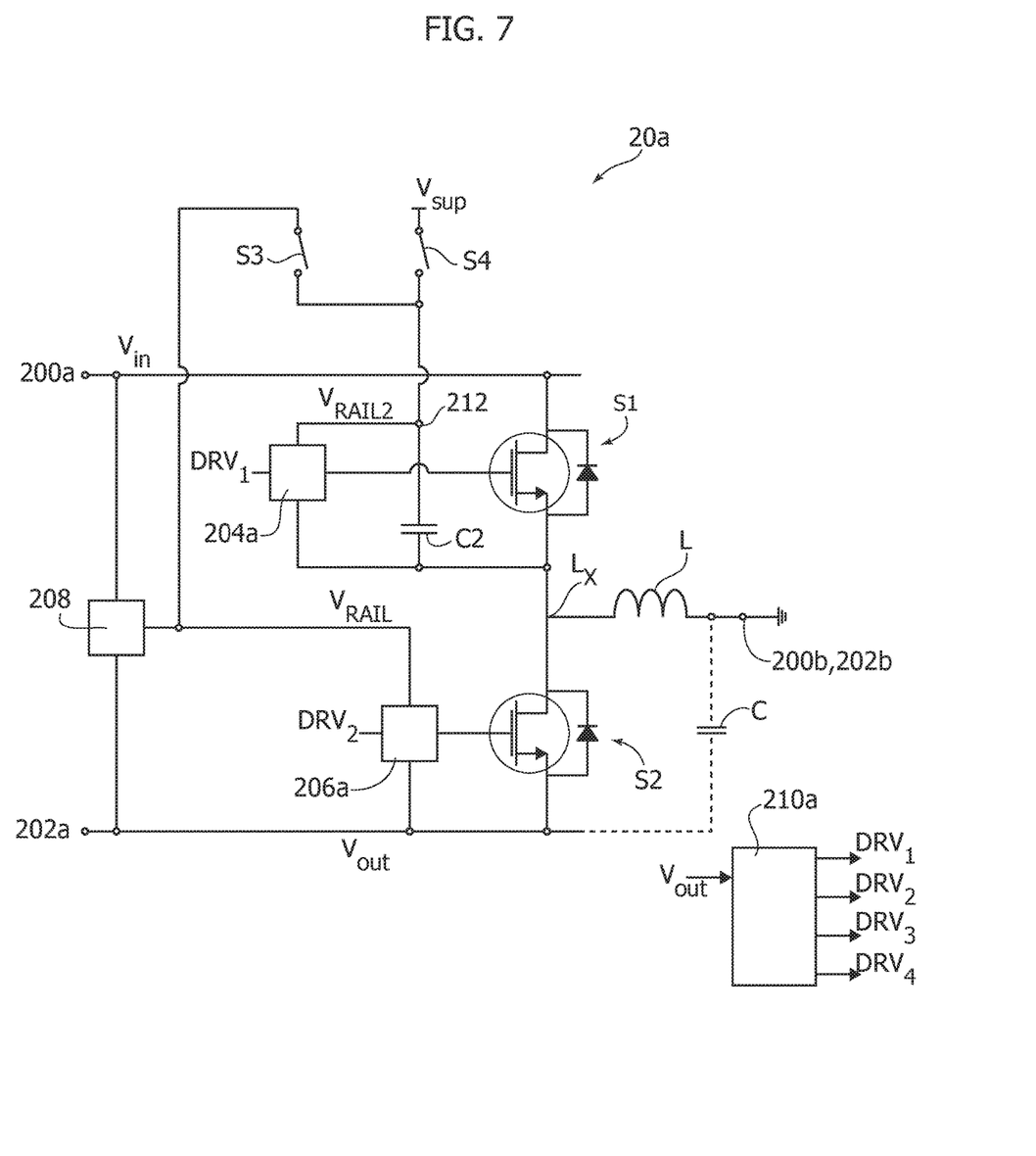
FIG. 7 shows an embodiment of a half-bridge driver circuit.

FIG. 7 shows a modified embodiment of the circuit 20a.

Specifically, again the circuit 20a comprises at least three terminals 200a, 202a and 200b/202b.

In the embodiment considered, a half-bridge comprises two n-channel FETs S1 and S2, such as NMOS, connected between the terminals 200a and 202a. Specifically, the drain terminal of the transistor S1 is connected (e.g., directly) to the terminal 200a, the source terminal of the transistor S1 is connected (e.g., directly) to the drain terminal of the transistor S2 and the source terminal of the transistor S1 is connected (e.g., directly) to the terminal 202a.

Moreover, the intermediate node/switching node Lx between the transistors S1 and S2, i.e. the source terminal of the transistor S1/the drain terminal of the transistor S2, is connected (e.g., directly) via an inductance L, to the terminal 200b/202b. For example, in case of an electronic converter, the inductive component L may be an inductor or a transformer.

However, the inductive component L may also be directly an inductive load, such as an electric motor. In various embodiments, a capacitor C may be connected (e.g., directly) between the terminal(s) 200b/202b and the terminal 202a.

For example, as described in the foregoing, in case of an inverting buck-boost converter, the terminals 200a and 200b represent input terminals to be connected to an input voltage $V_{in}$, and the terminals 202a and 202b represent output terminals used to provide an output voltage $V_{out}$. Conversely, in a buck converter, the terminals 200a and 202a would represent the input terminals to be connected to an input voltage, and the terminals 200b/202b and 202a would represent the output terminals used to provide an output voltage corresponding to the voltage at the capacitor C.

In the embodiment considered, the gate terminal of the low-side transistor S2 is again driven via a driver circuit 206 as a function of the drive signal $DRV_2$. Specifically, for this purpose, the circuit 20a comprises a voltage regulator 208 configured to generate a voltage $V_{RAIL}$ (being greater than the voltage at the terminal 202a, e.g. $V_{out}$) as a function of the voltage between the terminals 200a and 202a, i.e. the voltage regulator 208 receives at input the voltage ($V_{in}$-$V_{out}$) between the terminals 200a and 202a, and provides at output a voltage $V_{RAIL}$, which is referred to the terminal 202a. Accordingly, the driver circuit 206 may drive the gate terminal of the transistor S2 with a voltage (with respect to the terminal 202a/source terminal of the transistor S2) selected between zero and $V_{RAIL}$. For example, in various embodiments, the voltage $V_{RAIL}$ may be selected between 3 and 12 VDC, e.g. 5 VDC (with respect to the voltage $V_{out}$ at the terminal 202a).

In the embodiment considered, the gate terminal of the high-side transistor S2 is driven via a driver circuit 204a as a function of the drive signal $DRV_1$. Specifically, in the embodiment considered, the driver circuit 204a is powered via a positive voltage at a (bootstrap) capacitor C2. More specifically, in the embodiment considered, a first terminal of the capacitor C2, indicated again with node 212, is connected (e.g., directly) via an electronic switch S3 to the output of the voltage regulator 208 providing the voltage $V_{RAIL}$ and the second terminal of the capacitor C2 is connected (e.g., directly) to the switching node Lx. Accordingly, in the embodiment considered, the diode D of FIG. 6 has been replaced with the electronic switch S3.

Moreover, in the embodiment considered, the first terminal of the capacitor C2/node 212 is connected (e.g., directly) via a further electronic switch S4 to a positive supply voltage $V_{sup}$. In various embodiments, the voltage $V_{sup}$ is a positive voltage referred to the terminal 200b/202b, e.g. ground. For example, the voltage $V_{sup}$ may be identical to $V_{RAIL}$ as voltage range but referred to the terminal 200b/202b.

Accordingly, in the embodiment considered, the node 212 may be connected selectively via the switch S3 to the voltage $V_{RAIL}$ (being referred to the terminal 202a) or via the switch S4 the voltage $V_{sup}$ (being referred to the terminal 200b/202b). Moreover, the voltage $V_{RAIL2}$ at the node 212 (being referred to the node Lx) is used to power the driver 204a.

In the embodiment considered, the electronic switches S1, S2, S3 and S4 are driven via a control circuit 210a, which generates respective drive signal $DRV_1$, $DRV_2$, $DRV_3$, and $DRV_4$. Generally, insofar as the switches S3 and S4 may be low-power switches, no specific slew-rate control may be required for these switches.

Figure 9:
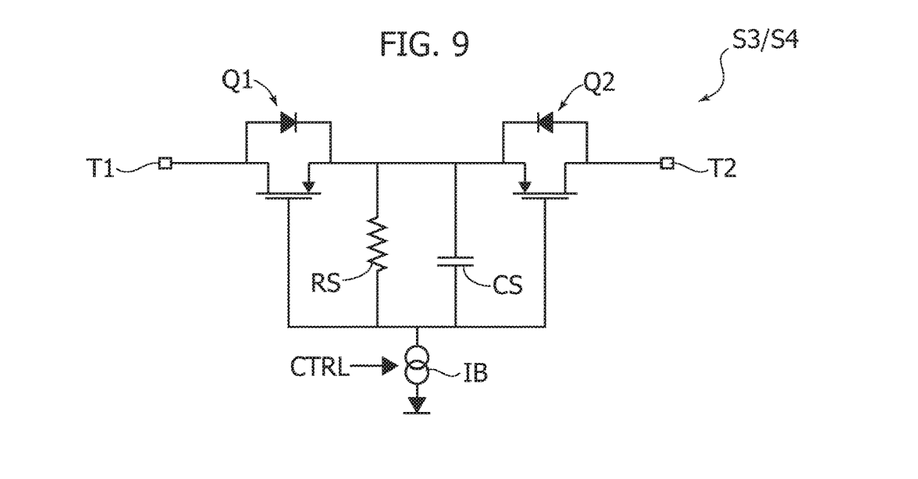
FIG. 9 shows an embodiment of an electronic switch adapted to be used in the half-bridge driver circuit of FIG. 7.

For example, FIG. 9 shows a possible embodiment for each of the switches S3 and/or S4.

Generally, the switch (S3 or S4) comprises a first and a second terminal T1 and T2 defining the current path of the electronic switch, and a control terminal for receiving a control signal CTRL indicating whether the switch should be closed (current may pass between the terminals T1 and T2) or opened (current may not pass between the terminals T1 and T2), i.e. the signal CTRL corresponds to the drive signal $DRV_3$ for the switch S3 and the drive signal $DRV_4$ for the switch S4.

Substantially, in the embodiments considered, the switch comprises two p-channel FETs Q1 and Q2, such as PMOS, in back-to-back configuration. Specifically, the drain terminal of the transistor Q1 is connected to the terminal T1, the source terminal of the transistor Q1 is connected to the source terminal of the transistor Q2 and the drain terminal of the transistor Q2 is connected to the terminal T2. Moreover, each of the transistors Q1 and Q2 comprises a respective (body) diode (with the cathode connected to the source terminal and the anode connected to the drain terminal).

In the embodiments, the switch also comprises a bias circuit configured to charge or discharge the gate terminals of the transistors Q1 and Q2 as a function of the control signal CTRL, thereby opening or closing the switch.

For example, in the embodiment considered, the bias circuit comprises a current generator IB configured to apply a positive or negative current to the gate terminals of the transistors Q1 and Q2 as a function of the control signal CTRL. In various embodiments a filter circuit (comprising, for example, a resistor RS and a capacitor CS) may be connected between the current generator IB and the gate terminals of the transistors Q1 and Q2.

Figure 8:
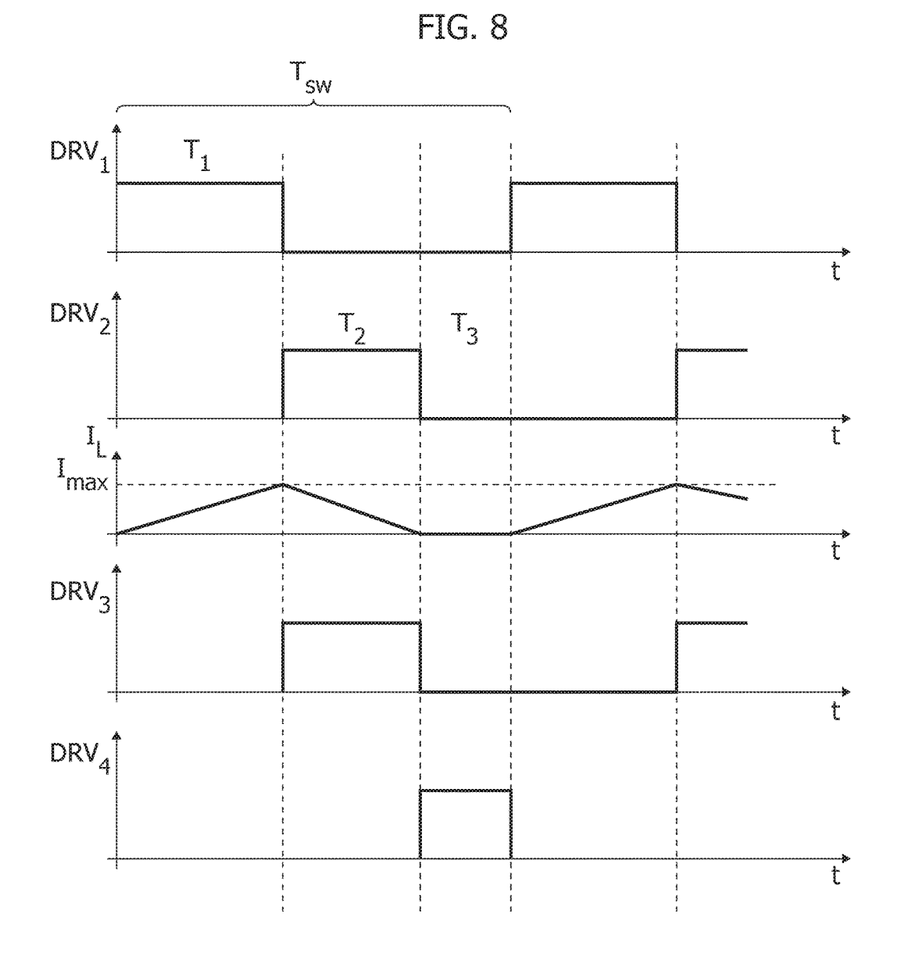
FIG. 8 shows an embodiment of the operation of the half-bridge driver circuit of FIG. 7.

FIG. 8 shows an embodiment of the driving scheme implemented within the control unit 210a.

As described in the foregoing, the intermediate node between the electronic switches S1 and S2 represents a switching node Lx, and by driving the switches S1 and S2 via the drive signals $DRV_1$ and $DRV_2$, the control circuit 210a may: close the electronic switch S1 and open the electronic switch S2, thereby connecting the switching node Lx to the voltage at the node 200a (interval $T_1$); open the electronic switch S1 and close the electronic switch S2, thereby connecting the switching node Lx to the voltage at the node 202a (interval $T_2$); and open both the electronic switch S1 and the electronic switch S2, thereby disconnecting the switching node Lx (interval $T_3$).

For example, in various embodiments, the above sequence of three intervals $T_1$, $T_2$ and $T_3$ are repeated periodically.

In various embodiments, the control circuit 210a is configured to drive the switches S3 and S4 via the drive signals $DRV_3$ and $DRV_4$, in order to: close the electronic switch S3 and open the electronic switch S4, when the electronic switch S1 is opened and the electronic switch S2 is closed, i.e. during the interval $T_2$ of FIG. 3B; open the electronic switch S3 and close the electronic switch S4, when the electronic switch S1 is opened and the electronic switch S2 is opened, i.e. during the interval $T_3$ of FIG. 3B; and open the electronic switch S3 and open the electronic switch S4, when the electronic switch S1 is closed and the electronic switch S2 is opened, i.e. during the interval $T_1$ of FIG. 3B.

Accordingly, when the electronic switch S1 is opened and the electronic switch S2 is closed, the switching node Lx is connected to the node 202a and the node 212/capacitor C2 is charged to the voltage $V_{RAIL}$ via the switch S3. Conversely, when the electronic switch S1 is opened and the electronic switch S2 is opened, the switching node Lx is disconnected and the node 212/capacitor C2 is charged to the voltage $V_{sup}$ via the switch S4.

Accordingly, when the switch S1 has to be closed at the beginning of the interval $T_1$, the capacitor C2 is charged either to the voltage $V_{RAIL}$ (switching at the end of the interval $T_2$) or $V_{sup}$ (switching at the end of the interval $T_3$). Thus, when the control circuit 210a sets the drive signal $DRV_1$ at the beginning of the interval $T_1$, the voltage $V_{RAIL2}$ at the node 212 is shifted via the capacitor C2 following the voltage increase at the switching node Lx. Thus, when the electronic switch S1 is completely closed and the electronic switch S2 is opened, the switching node Lx is connected to the node 200a and the node 212 has a voltage $V_{RAIL}+V_{in}$ or $V_{sup}+V_{in}$, which thus permits to maintain closed the transistor S1.

Moreover, while closing the transistor S1, the driver circuit 204a is always powered with a substantially constant floating rail voltage $V_{RAIL2}$ generated with the bootstrap capacitor C2 (voltage between the node 212 and the switching node Lx), which permits to implement a slew-rate control also for high-side transistor S1. Thus, also a slew-rate controlled transition of the switching node Lx may be implemented, which e.g. permits to attenuate EMI disturbance generated by the switching activity.

For example, in this way, the driver circuits 204a and 206 may have the same architecture, and only the power supply of the respective driver circuit changes. Specifically, the low-side driver 206 operates with a supply voltage between the voltages $V_{OUT}$ (voltage at the source terminal of transistor S2) and $V_{RAIL}$, while the high-side driver 204a operates with a supply voltage between the voltage at the switching node Lx (voltage at the source terminal of transistor S1) and the voltage provided by the bootstrapped net. For example, the driver circuits 204a and 206 may be configured to receive the (binary) control signal $DRV_1$ and $DRV_2$, respectively, and generate respective signals, typically current signals, used to drive the gate terminal of the respective transistor S1 and S2, thereby charging the gate-source capacitance of the respective transistor S1 and S2. Accordingly, by varying the charge current of the gate-source capacitance, the driver circuit 204 may selectively vary the gate-source voltage $V_{GS}$ of the respective transistor S1 and S2 in order to implement a slew-rate control.

In various embodiments, in order to correctly recharge the capacitor C2 in all operating conditions of the converter, two different paths of recharge are provided for the bootstrapped capacitor C2. When working in CCM, the switching node Lx will continuously swing between the voltages $V_{in}$ (S1 closed) and $V_{out}$ (S2 closed) and during this last phase the bootstrap capacitor C2 will be recharged between $V_{out}$ and $V_{RAIL}$. Thus, at the next switching cycle (beginning of interval $T_1$), the capacitor C2 is charged and permits to correctly manage the activation of the high-side transistor S1.

Conversely, when working in DCM/PSM, the switching node Lx will swing between $V_{in}$ (S1 closed), $V_{out}$ (S2 closed) and then GND (S1 and S2 opened).

Specifically, when working in PSM, some switching cycles are skipped, i.e. after a DCM switching cycle, the switching node Lx will stay at GND (interval $T_3$). During this time, the bootstrap capacitor C2 is kept fully charged between GND and $V_{sup}$, in order to be able to correctly switch-on the high-side transistor S1 when a new switching cycle is started via the control circuit 210a, e.g. because the output voltage $V_{out}$ falls below a given threshold.

Generally, when operating in DCM, the node 212 may also remain disconnected during the interval $T_3$. In fact, when the time interval $T_3$ is sufficiently short, no further charging of the capacitor C2 may be required during the interval $T_3$. However, as described in the foregoing, the node 212 may also be connected to the voltage $V_{sup}$ during the interval $T_3$.

Accordingly, the gate of the high-side power transistor S1 may be driven in all operating conditions with a well-defined DC supply voltage, thereby avoiding unknown and undesired conditions of the transistor S1.

Generally, while the voltage regulator 208 and the bootstrap circuit (C2, S3 and S4) have been shown separately, these circuits may also be integrated in the driver circuits 204a and 206 and/or may be integrated with the driver circuits 204a and 206 in a half-bridge driver circuit, e.g. in the form of an integrated circuit. Moreover, also the control circuit 210a may be integrated in such an integrated circuit, thereby forming e.g. and electronic converter control chip. Generally, the transistors may be internal or external with respect to such an integrated circuit.

The solutions disclosed herein have thus one or more of the following advantages with respect to the prior-art solutions:

a double n-channel FET/NMOS structure may be used, which permits to optimize performance and area of the device;

the power supply of the high-side driver 204a is based on a dedicated rail that floats and follows the voltage variation at the switching node Lx, thereby ensuring the correct supply voltage for the driver 204a;

all operating conditions (CCM/DCM/PSM) of the inductance L may be handled, both with positive and negative voltages; and slew-rate controlled transitions may be implemented for both n-channel power transistor, thus permitting that both rising and falling edges of the switching node Lx may be controlled;

Of course, without prejudice to the principle of the invention, the details of construction and the embodiments may vary widely with respect to what has been described and illustrated herein purely by way of example, without thereby departing from the scope of the present invention, as defined by the ensuing claims.

For example, while the present solution has been described mainly in the context of an inverting buck-boost converter, the same driving may be applied also to other circuits comprising a half-bridge or full-bridge architecture. For example, in the context of a full-bridge the terminal 200b/202b may correspond to the intermediate node/switching node of a further half-bridge comprising two electronic switches.

The claims form an integral part of the technical teaching of the description provided herein.

The invention claimed is:

1. A half-bridge circuit, comprising:
a first, a second and a third terminal;
a half-bridge comprising a first n-channel FET and a second n-channel FET connected in series between said first and said second terminal, wherein an intermediate node between said first n-channel FET and said second n-channel FET is a switching node;
an inductance connected between said switching node and said third terminal;
a first driver circuit configured to drive a gate terminal of said first n-channel FET as a function of a first drive signal;
a second driver circuit configured to drive a gate terminal of said second n-channel FET as a function of a second drive signal;
a voltage regulator configured to generate at an output terminal a first supply voltage as a function of a voltage between said first and second terminals, wherein said first supply voltage is used to power supply said second driver circuit; and
a control circuit configured to generate said first and second drive signals for said first and second n-channel FETs, respectively, in order to:
close said first n-channel FET and open said second n-channel FET during a first time interval;
open said first n-channel FET and close said second n-channel FET during a second time interval; and
open both said first n-channel FET and said second n-channel FET during a third time interval;
wherein the half-bridge circuit further comprises:
a capacitor comprising a first terminal connected via a first electronic switch to the output terminal of said voltage regulator and a second terminal connected to said switching node, wherein a voltage at the first terminal of said capacitor is used to power supply said first driver circuit; and
a second electronic switch connected between said first terminal of said capacitor and a second supply voltage; and wherein said control circuit is configured to generate a third and a fourth drive signal for said first and second electronic switches, respectively, in order to:
open both said first and second electronic switches during said first time interval;
close said first electronic switch and open said second electronic switch during said second time interval; and
open said first electronic switch and close said second electronic switch during said third time interval.

2. The half-bridge circuit according to claim 1, wherein said half-bridge circuit is an inverting buck-boost converter, said first terminal and said third terminal are configured to receive an input voltage and said second terminal and said third terminal are configured to provide an output voltage.

3. The half-bridge circuit according to claim 2, wherein the inverting buck-boost converter is operated in a discontinuous conduction mode or a pulse skip mode.

4. The half-bridge circuit according to claim 2, wherein the first supply voltage is in reference to the second terminal and is greater than a voltage at the second terminal, and wherein the second supply voltage is a positive voltage in reference to said third terminal.

5. The half-bridge circuit according to claim 2, wherein the first supply voltage is in reference to the second terminal, and wherein the second supply voltage is identical to said first supply voltage but is in reference to said third terminal.

6. The half-bridge circuit according to claim 5, wherein the first supply voltage is negative with respect to the third terminal.

7. The half-bridge circuit according to claim 1, wherein said half-bridge circuit is a buck converter, wherein said first terminal and said second terminal are configured to receive an input voltage, and said third terminal and said second terminal are configured to provide an output voltage.

8. The half-bridge circuit according to claim 7, wherein the buck converter is operated in a discontinuous conduction mode or a pulse skip mode.

9. The half-bridge circuit according to claim 1, wherein a further capacitor is connected between said third terminal and said second terminal.

10. The half-bridge circuit according to claim 1, wherein said first driver circuit is configured to generate a charge current at a gate terminal of said first n-channel FET as a function of said first drive signal, thereby charging a gate-source capacitance of said first n-channel FET to one of:
the voltage at said first terminal of said capacitor, thereby closing said first n-channel FET, or
the voltage at said switching node, thereby opening said first n-channel FET.

11. The half-bridge circuit according to claim 1, wherein said second driver circuit is configured to generate a charge current at a gate terminal of said second n-channel FET as a function of said second drive signal, thereby charging a gate-source capacitance of said second n-channel FET to one of:
said first supply voltage, thereby closing said second n-channel FET, or
the voltage at said second terminal, thereby opening said second n-channel FET.

12. The half-bridge circuit according to claim 11, wherein the first supply voltage is in reference to the second terminal and is greater than the voltage at the second terminal, and wherein the second supply voltage is identical to said first supply voltage but is in reference to said third terminal.

13. The half-bridge circuit according to claim 1, wherein each of said first and second electronic switches comprise:

a first and a second node defining a current path, and a control terminal for receiving a control signal indicating whether the electronic switch should be closed or opened;

a first and a second p-channel FET, wherein a drain terminal of the first p-channel FET is connected to the first node, a source terminal of said first p-channel FET is connected to a source terminal of said second p-channel FET and a drain terminal of said second p-channel FET is connected to said second node; and a bias circuit configured to charge or discharge gate terminals of said first and second p-channel FETs as a function of the control signal, thereby opening or closing the electronic switch.

14. The half-bridge circuit according to claim 13, wherein the first supply voltage is in reference to the second terminal and is greater than a voltage at the second terminal, and wherein the second supply voltage is identical to said first supply voltage but is in reference to said third terminal.

* * * * *